(12) United States Patent
Sakaguchi

(10) Patent No.: US 7,820,479 B2
(45) Date of Patent: Oct. 26, 2010

(54) CONDUCTIVE BALL MOUNTING METHOD

(75) Inventor: Hideaki Sakaguchi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 149 days.

(21) Appl. No.: 12/173,256

(22) Filed: Jul. 15, 2008

(65) Prior Publication Data

US 2009/0020591 A1      Jan. 22, 2009

(30) Foreign Application Priority Data

Jul. 19, 2007   (JP)   ............... 2007-188630

(51) Int. Cl.
H01L 21/44  (2006.01)
H01L 21/48  (2006.01)
H01L 21/50  (2006.01)

(52) U.S. Cl. ............ 438/106; 438/706; 438/745; 257/E21.229; 257/E21.245; 257/E21.499; 257/E21.508

(58) Field of Classification Search ............ 438/106, 438/612, 613, 687, 706, 745; 257/E21.229, 257/245, 499, 508
See application file for complete search history.

(56) References Cited

U.S. PATENT DOCUMENTS

| | | | | |
|---|---|---|---|---|
| 5,284,287 A | * | 2/1994 | Wilson et al. | 228/180.22 |
| 5,431,332 A | * | 7/1995 | Kirby et al. | 228/246 |
| 5,655,704 A | * | 8/1997 | Sakemi et al. | 228/246 |
| 5,658,827 A | * | 8/1997 | Aulicino et al. | 228/180.22 |
| 6,191,022 B1 | * | 2/2001 | Creswick | 438/612 |

FOREIGN PATENT DOCUMENTS

| | | |
|---|---|---|
| JP | 09-107045 | 4/1997 |
| JP | 10-126046 | 5/1998 |
| JP | 2001-320160 | 11/2001 |

* cited by examiner

Primary Examiner—David Nhu
(74) Attorney, Agent, or Firm—Rankin, Hill & Clark LLP

(57) ABSTRACT

There is provided a method of mounting one conductive ball on each of a plurality of connection pads on a substrate. The method includes: (a) providing a pre-alignment base including: a support layer formed to allow a flux to pass therethrough; and an alignment layer provided on the support layer and having pockets for containing the conductive ball; (b) applying a paste containing the conductive balls dispersed in the flux onto the alignment layer such that each of the pockets receives one of the conductive balls together with the flux; (c) aligning the pre-alignment base with the substrate such that each of the pockets corresponds to one of the connections pads; and (d) transferring the paste contained in each of the pockets onto the connection pads, thereby mounting the conductive balls along with the flux on the connection pads.

8 Claims, 3 Drawing Sheets

CONDUCTIVE BALL MOUNTING METHOD

This application is based on and claims priority from Japanese Patent Application No. 2007-188630, filed on Jul. 19, 2007, the entire contents of which are hereby incorporated by reference.

BACKGROUND

1. Technical Field

The present disclosure relates to a method of mounting one conductive ball on each of a plurality of connection pads on a substrate.

2. Related Art

In the related art, in forming solder bumps on connection pads for flip-chip connection of a substrate such as a wafer or a circuit substrate, a solder paste is screen printed and reflowed. However, with an increase in density of a semiconductor device, the bump pitch needs to be reduced to a pitch as fine as 200 µm or further 150 µm. When a solder paste is screen printed at such a fine pitch, bridge between bumps or adhesion of the solder paste to a printing mask occurs. For this reason, formation of bumps at a fine pitch is difficult to perform with screen printing.

Thus, as a fine pitch bump formation method, there is a method in which solder balls are provided on connection pads and then reflowed.

As one method, there is a method to be performed on connection pads for board mounting on an external connection terminal side of Ball Grid Array (BGA), in which solder balls are chucked by a chucking jig and then are carried and mounted on the connections pads. On the connection pads, adhesive soldering flux is coated in advance. As a result, the solder balls adhere onto the connection pads, and fixed thereto. However, in this case, the solder ball diameter is as large as about 0.3 to 0.7 mm. In contrast, the solder ball diameter for fine pitch needs to be set at, at least 200 µm or less. In cases where the solder balls are thus fine, the solder balls agglomerate each other by the action of static electricity, and they cannot be accurately chucked on the chucking portion of the chucking jig under the influence of airflow. Further, the chucking portion of the chucking jig needs to be decreased in size, impractically resulting in a higher manufacturing cost.

As another method, there is performed a method in which solder balls are distributed into openings of a mask mounted on a substrate (so-called "distribution method"). Namely, a flux is coated on connection pads of the substrate, and then the pads and a metal mask are aligned and overlapped with each other. Then, a large number of solder balls are mounted on the metal mask, and the solder balls are slid over the mask using a flexible blade (squeegee). As a result, each of the solder balls is distributed into each opening of the mask, and is disposed on each connection pad aligned with its corresponding opening and is bonded and fixed by an adhesive flux coated on the connection pads. The solder balls remaining on the mask are collected by a collection mechanism.

The distribution method is disclosed in JP-A-10-126046, for example. Also, as a modified method thereof, JP-A-2001-320160 discloses a method in which solder balls are mounted, then a solder paste is printed and then a mask is removed. Also, JP-A-09-107045 discloses a method in which a solder paste is used in place of a flux.

In the method of mounting solder balls using a mask, in any case, it is necessary to prevent the flux coated on the connections pads on the substrate from adhering to the mask back side. When the flux adheres to the mask, the balls distributed into the mask openings are bonded to the mask. Thus, the balls are not mounted on the connection pads on the substrate. For this reason, there have been devised various countermeasures such as an increase in opening diameter of the mask, insertion of a spacer between the substrate and the mask, and use of an uneven mask.

However, when the size of each solder ball is as fine as 200 µm or less for finer pitch, unfavorably, it is difficult to prevent the adhesion of the paste onto the mask with reliability even if the foregoing countermeasures are implemented.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

It is an aspect of the present invention to provide a method of mounting conductive balls such as solder balls, in which fine solder balls can be arranged on connection pads on a substrate without insufficient mounting of solder balls due to the adhesion of a flux to a mask.

According to one or more aspects of the present invention, a method of mounting one conductive ball on each of a plurality of connection pads on a substrate, the method comprising:

(a) providing a pre-alignment base including: a support layer formed to allow a flux to pass therethrough; and an alignment layer provided on the support layer and having pockets for containing the conductive ball;

(b) applying a paste containing the conductive balls dispersed in the flux onto the alignment layer such that each of the pockets receives one of the conductive balls together with the flux;

(c) aligning the pre-alignment base with the substrate such that each of the pockets corresponds to one of the connections pads; and (d) transferring the paste contained in each of the pockets onto the connection pads, thereby mounting the conductive balls along with the flux on the connection pads.

According to one or more aspects of the present invention, in step (b), the paste is applied onto the alignment layer with an absorption layer for absorbing the flux being placed in close contact with a back surface of the support layer opposite to a surface on which the alignment layer is provided.

According to one or more aspects of the present invention, the support layer has through holes provided to correspond to the pockets, and the through holes allow the flux to pass therethrough.

According to one or more aspects of the present invention, the support layer is shaped into a mesh to allow the flux to pass therethrough.

According to one or more aspects of the present invention, in step (b), the paste is applied onto the alignment layer by a squeegee.

According to one or more aspects of the present invention, in step (b), the paste is applied onto the alignment layer by piston pressurization.

According to one or more aspects of the present invention, in step (d), the paste is transferred onto the connection pads by pressing with a presser.

According to one or more aspects of the present invention, in step (d), the paste is transferred onto the connection pads by gas blast from the back surface of the support layer.

According to the present invention, conductive balls and a flux are mixed to form a paste. Then, the paste is applied onto a pre-alignment base, and the paste containing one of the conductive balls is contained in each of the pockets. Then, the paste is transferred to the connection pads on the substrate from the respective pockets. As a result, it is possible to arrange each of the conductive balls along with the flux on each connection pad. Therefore, it is possible to arrange the conductive balls on the connection pads without using a mask.

Other aspects and advantages of the invention will be apparent from the following description, the drawings and the claims.

BRIEF DESCRIPTION OF THE DRAWINGS

The above and other aspects, features and advantages of the present invention will be more apparent from the following more particular description thereof, presented in conjunction with the following drawings wherein.

DETAILED DESCRIPTION

Exemplary embodiments of the present invention will be described with reference to the drawings hereinafter.

Further, as the conductive balls, other than the solder balls, metal balls such as copper balls, balls each formed by providing a solder layer on the surface of the core of a copper ball, balls each formed by providing a solder layer on the surface of the core of a resin ball, or balls each formed by providing a layer of nickel or copper on the surface of the core of a resin ball can be used.

First Embodiment

FIGS. 1A to 1E show a solder ball mounting method according to a first embodiment of the present invention.

Figure 1A:
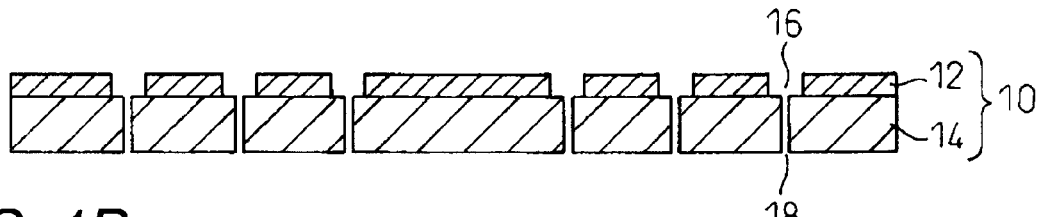
FIGS. 1A to 1E are cross sectional views showing steps of arranging solder balls on connection pads according to a first embodiment of the present invention.

Firstly, as shown in FIG. 1A, a pre-alignment base 10 includes an alignment layer 12 having pockets 16 at solder ball mounting positions, and a support layer 14 on which the alignment layer 12 is formed. The support layer 14 includes through holes 18 through which a flux (described later) passes at the pockets 16 of the alignment layer 12.

When the diameter of the solder balls is set to 100 μm, the dimension examples of respective portions are as follows.

Opening diameter of the pocket 16: 140 μm
Thickness of the alignment layer 12: 100 μm
Thickness of the support layer 14: 50 μm
Opening pitch of the pockets 16: 200 μm
The alignment layer 12 might be formed by additive plating of Ni or the like. The support layer 14 might be formed by additive plating of Ni or by processing a resin substrate.

Figure 1B:
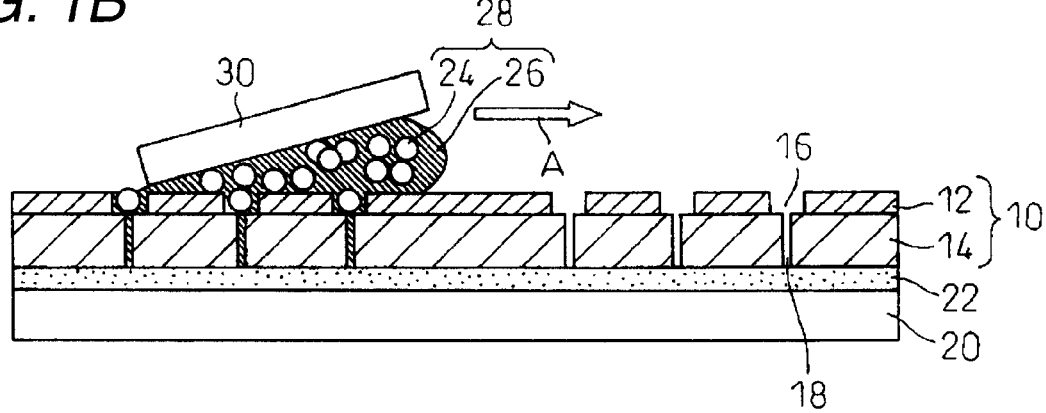

Then, as shown in FIG. 1B, on a stage 20, a flux absorption sheet 22 such as cloth or paper is mounted. The pre-alignment base 10 is mounted thereon. Thus, the back side of the pre-alignment base 10 is brought in close contact with the flux absorption sheet 22.

In this state, a paste 28 containing solder balls 24 dispersed in a flux 26 is printed from the alignment layer 12 side of the pre-alignment base 10. Thus, the paste 28 containing one of the solder balls 24 are contained in each pocket 16. The paste 28 can be printed by moving a squeegee 30 in a direction of an arrow "A" as shown. Alternatively, as described later, the paste 28 can be printed by piston pressurization on the alignment layer 12.

The solder balls 24 of the paste 28 injected into the pockets 16 are contained in the pockets 16. The flux 26 fills the portion other than the space occupied by the solder balls 24 in the pockets 16. The excess flux 26 passes through the through holes 18, and is absorbed by the flux absorption sheet 22 placed in close contact on the back side of the pre-alignment base 10. This can prevent remaining of the excess flux on the surface of the pre-alignment base 10 and the contamination of the stage 20.

The flux 26 herein used might basically have the same components as those of the part other than the solder particles of the solder paste to be commonly used in screen printing. Component composition of the flux 26 can be appropriately adjusted so as to have a fluidity suitable for printing, and also so as to exhibit adhesion suitable for accurately bonding and fixing the solder balls 24 in such a state that the solder balls 24 are contained in the pockets 16 and in such a state that the solder balls 24 are transferred on the connection pads.

Figure 1C:
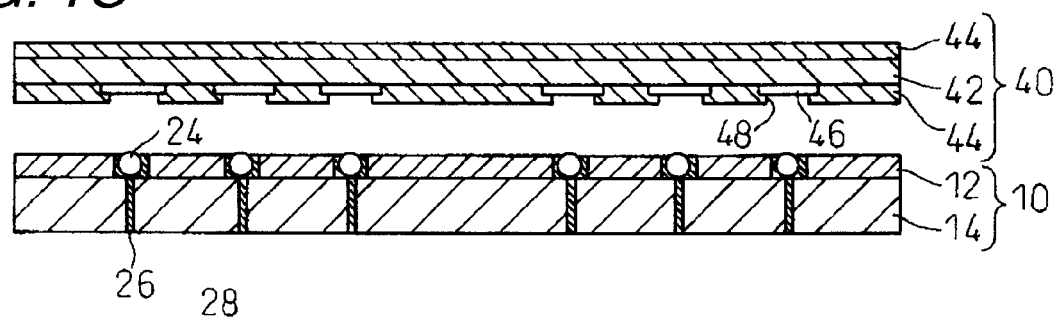

Then, as shown in FIG. 1C, the stage 20 and the absorption sheet 22 are removed from the pre-alignment base 10, and the pockets 16 are aligned with connection pads 46 on a substrate 40. Also, FIG. 1C shows the pre-alignment base 10 facing upwardly similarly with the printing step, so that the space for vertical reverse is eliminated. When a space enough for reverse is ensured, the subsequent steps can be performed with the pre-alignment base 10 reversed downwardly.

The substrate 40 is a multilayer circuit substrate. The multilayer circuit substrate is obtained by forming wiring layers and insulation layers on opposite sides of a core substrate made of a resin, including through holes, by build-up method or the like. On both of the front and back sides of a multilayer circuit portion 42, solder resist layer 44 are formed. A plurality of connection pads 46 arrayed on the front surface (bottom side of the figure) of the multilayer circuit portion 42 are exposed from openings 48 of the solder resist layer 44.

Figure 1D:
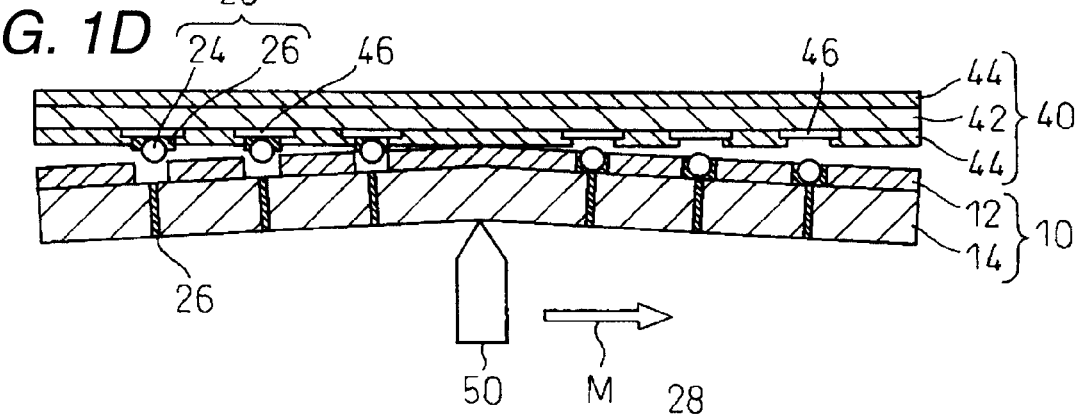

Then, as shown in FIG. 1D, the paste 26 retained in the respective pockets 16 is transferred onto respective connection pads 46. Thus, the solder balls 24 with the flux 26 are mounted on the connection pads 46.

This transfer process is carried out, as shown in FIG. 1D, as with a transfer method in common screen printing, in the following manner. While pressing a part of the back side of the pre-alignment base 10 by a presser 50 such as a squeegee, and pushing it against the surface of the substrate 40, the presser 50 is horizontally moved as indicated with an arrow "M". With this transfer method, the pre-alignment base 10 is bent as shown in FIG. 1D, and thus it is locally pressed. Therefore, in order for the pre-alignment base 10 to have enough flexibility, the material and the thickness are selected.

Figure 1E:
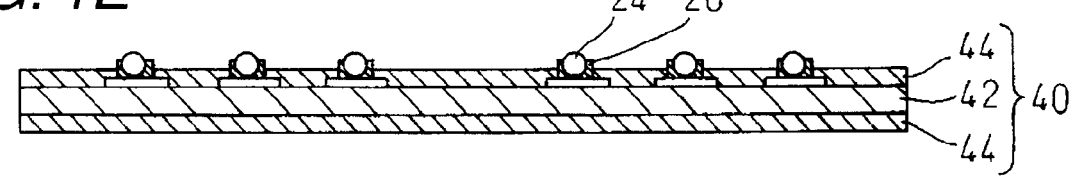

Finally, as shown in FIG. 1E, after removing the pre-alignment base 10, the solder balls 24 are bonded and fixed in an array on the connection pads 46 of the substrate 40 by the flux 26.

Second Embodiment

Figure 2:
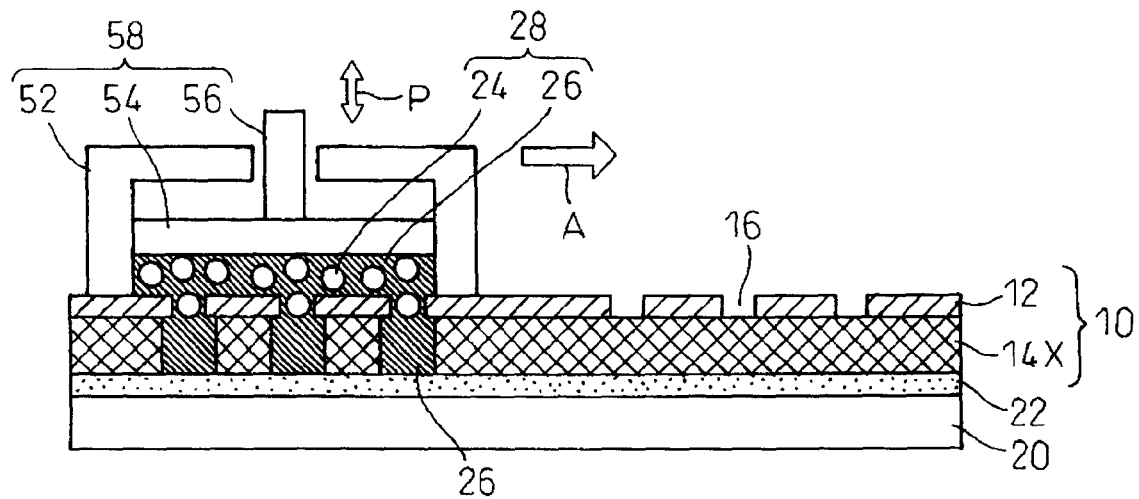
FIG. 2 is a cross sectional view showing a state in which the solder balls with a flux are applied onto a pre-alignment base by piston pressurization according to a second embodiment of the present invention.

FIG. 2 shows a second embodiment in which the paste 28 is printed onto the pre-alignment base 10 by piston pressurization on the alignment layer 12. The pre-alignment base 10 is configured, unlike in the first embodiment, such that a support layer 14X includes a mesh. However, this merely shows one alternative. The pre-alignment base 10 is not limited to a mesh particularly in this case. It may also be configured not in a mesh but in a form having the through holes 18 in the same manner as in the first embodiment.

In a piston presser 58, a piston 54 vertically slides in the direction of an arrow "P" by the vertical movement of a piston shaft 56 in a cylinder 52. The paste 28 including the solder balls 24 and the flux 26 is printed on the alignment layer 12. Then, the paste 28 containing one solder ball 24 is injected into each of the pockets 16.

The solder balls 24 of the paste 28 injected into the pockets 16 are retained each of the pockets 16. The flux 26 fills the portion other than the space occupied by the solder balls 24 in the pockets 16. The excess flux 26 passes through the mesh of the support layer 14X, and is absorbed by the flux absorption sheet 22 placed in close contact on the back side of the pre-alignment base 10. This can prevent remaining of the excess flux on the surface of the pre-alignment base 10 and the contamination of the stage 20.

The piston presser 58 is moved as indicated with the arrow "A", and in the next solder ball arrangement region, the same operation as described above is carried out, and then arrangement/movement is repeatedly performed. Thus, the solder balls can be arranged on the pre-alignment base 10 corresponding to the entire surface or the necessary part of the substrate 40.

Third Embodiment

Figure 3A:
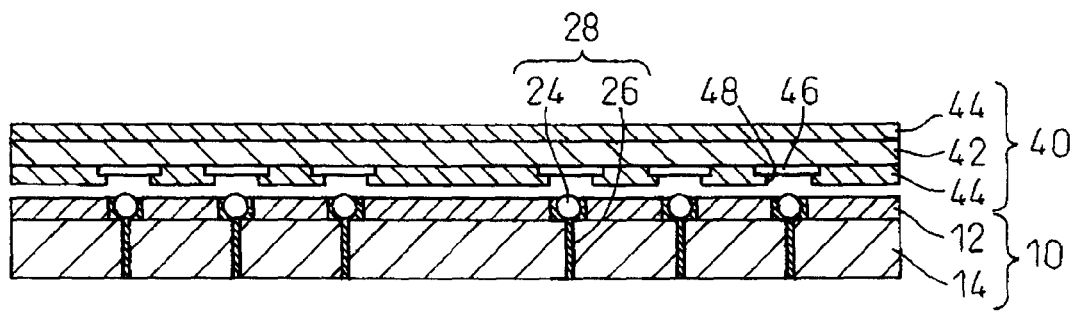
FIGS. 3A to 3C are cross sectional views showing steps of transferring the solder balls with the flux from the pre-alignment base to the connection pads on a substrate using air blow according to a third embodiment of the present invention.
Figure 3B:
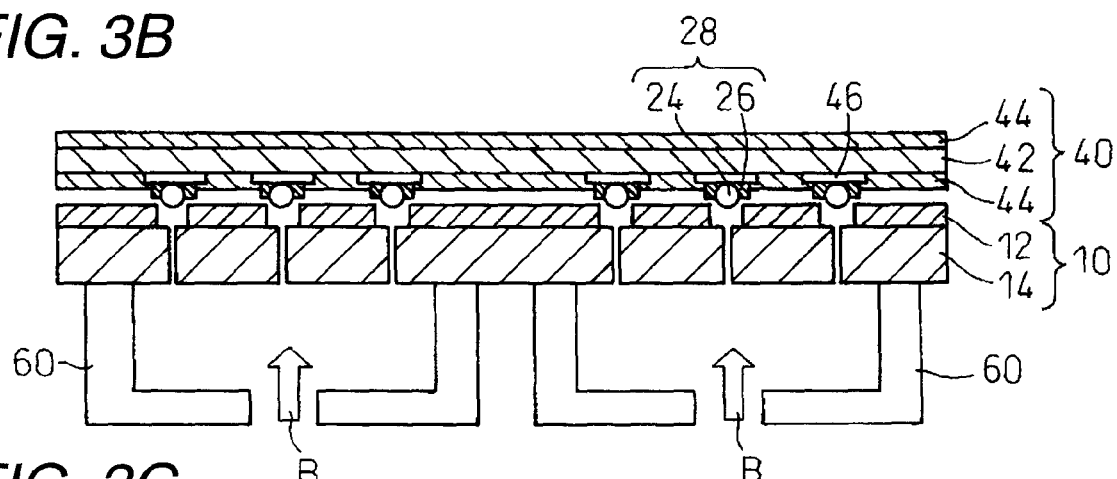
Figure 3C:
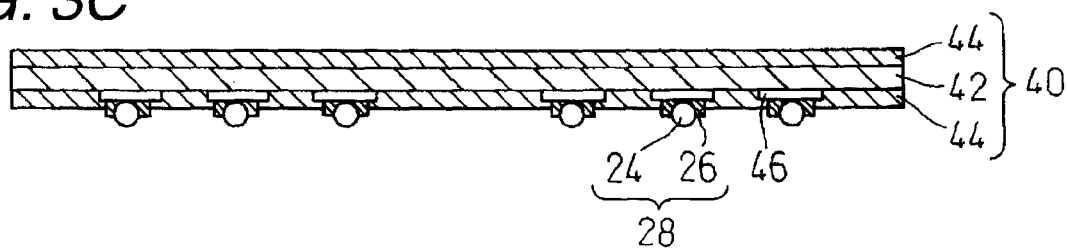

FIGS. 3A to 3C show a third embodiment in which the paste 28 is transferred from the pockets 16 of the pre-alignment base 10 onto the connection pads 46 of the substrate 40 by air blow from the back surface side of the support layer 14. Air blow is performed by blast of any gas such as air or nitrogen gas. In the first embodiment, the paste 28 is transferred by bending the pre-alignment base 10 with the presser 50 such as a squeegee, as with the transfer method in common screen printing. Therefore, in order for the pre-alignment base 10 to have enough flexibility, the material and the thickness of the pre-alignment base 10 are limited. According to the third embodiment, the pre-alignment base 10 is not required to have the flexibility as described above.

As shown in FIG. 3A, with the method in the first or second embodiment, the solder balls 24 are arranged on the pre-alignment base 10 in advance. The pre-alignment base 10 and the substrate 40 are aligned with each other. Then, both are allowed to come closer to each other, and held at a distance (several tens micrometers) that is suitable for transferring by air blow described below.

Then, as shown in FIG. 3B, an air blowing unit 60 is placed in close contact on the back side of the pre-alignment base 10. Thus, air blow "B" is effected from under, thereby to blow the paste 28 upwardly. Thus, the paste 28 including one of the solder balls 24 and the flux 26 is injected onto each connection pad 46 on the substrate 40, which is located several tens micrometers immediately above the pre-alignment base 10.

FIG. 3B shows an example in which two air blowing units 60 are operated simultaneously to perform the arrangement operations in two arrangement regions simultaneously. By performing the arrangement operations on a plurality of the arrangement regions simultaneously, it is possible to perform arrangement with high efficiency. However, the present invention is not limited thereto. It is also possible to process the arrangement regions one by one using one air blowing unit 60.

Finally, as shown in FIG. 3C, after removing the pre-alignment base 10, the solder balls 24 are bonded and fixed in an array on the connection pads 46 on the substrate 40 by the flux 26.

Fourth Embodiment

FIGS. 4A to 4H show an example in which the pre-alignment base 10 is formed as one body by processing of a silicon wafer.

Figure 4A:
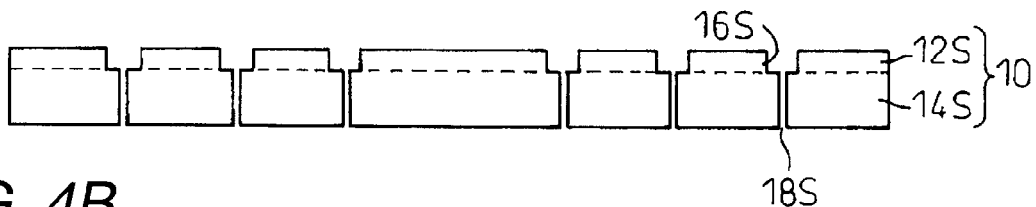
FIGS. 4A to 4H are cross sectional views showing steps of manufacturing the pre-alignment base of an integral structure from a silicon wafer according to a fourth embodiment of the present invention.

FIG. 4A shows the pre-alignment base 10 made of a silicon wafer in one body. The pre-alignment base 10 is in an integral structure in which an alignment layer 12S and a support layer 14S are integrated with each other. The alignment layer 12S has pockets 16S, and the support layer 14S has through holes 18S.

Figure 4B:
Figure 4C:
Figure 4C:
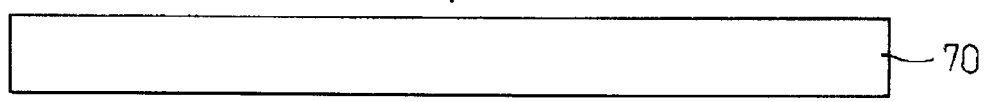

In order to form the pre-alignment base 10, firstly, as shown in FIG. 4B, a silicon wafer 70' is prepared. As shown in FIG. 4C, the silicon wafer 70' is formed into a silicon raw material 70 with a given thickness (e.g., 500 μm) by polishing.

Figure 4D:
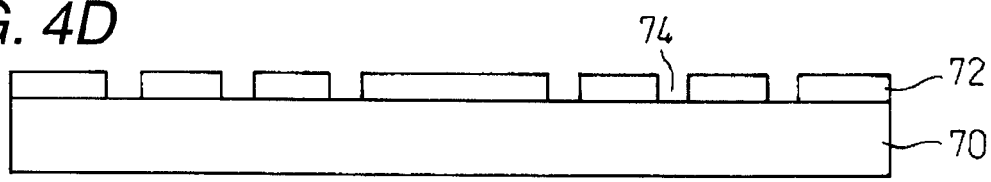

As shown in FIG. 4D, on the surface of the silicon raw substrate 70, a resist pattern 72 is formed through spin coating, exposure, and development. The resist pattern 72 has openings 74 corresponding to the opening diameter and the positions of the pockets 16S.

Figure 4E:
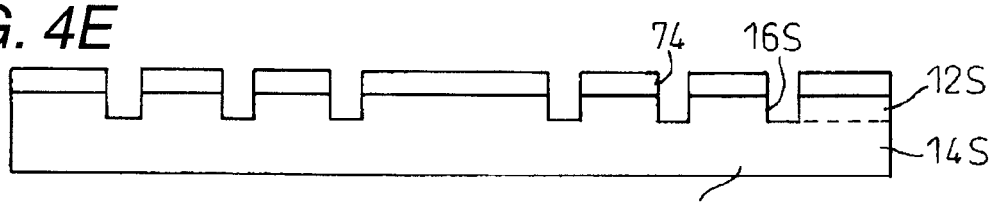

As shown in FIG. 4E, the silicon raw substrate 70 is etched by using the resist pattern 72 as a mask, and holes as the pockets 16S are formed in the silicon raw substrate 70. The etching can be performed by dry etching using a gas such as $SF_6$, or wet etching using TMAH (tetraethylammonium hydroxide), KOH, or the like. When the solder ball diameter is 100 μm, the dimensions of the pockets 16S are as follows: the opening diameter is 140 μm; the depth is 100 μm; and the opening pitch is 200 μm. The depth of the receptive pockets 16S corresponds to the thickness of the alignment layer 12S.

Figure 4F:
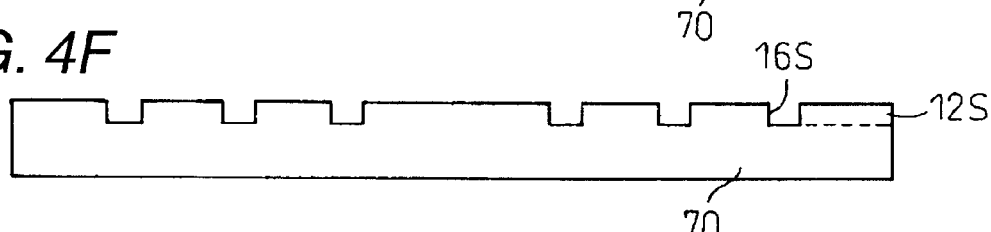

As shown in FIG. 4F, the resist pattern 72 is removed.

Figure 4G:
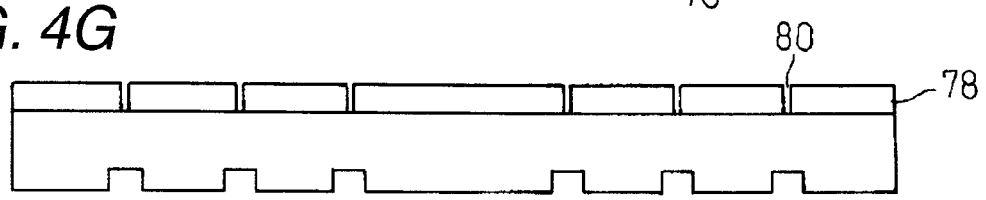

As shown in FIG. 4G, on the back side of the silicon raw substrate 70, a resist pattern 78 is formed through spin coating, exposure, and development. The resist pattern 78 has openings 80 corresponding to the opening diameter and the positions of the through holes 18S.

Then, the silicon raw substrate 70 is etched by using the resist pattern 78 as a mask, and then through holes 18S are formed which penetrate from the back side of the silicon raw substrate 70 to the pockets 16S. The etching can be performed, in the same manner as described above, by dry etching using a $SF_6$ gas, or wet etching using TMAH (tetraethylammonium hydroxide), KOH, or the like. When the solder ball diameter is 100 μm, the dimensions of the through holes 18S are as follows: the opening diameter is 80 μm; and the length is 400 μm. The length of the through holes 18S corresponds to the thickness of the support layer 14S.

Then, the resist pattern 78 is removed.

Figure 4H:
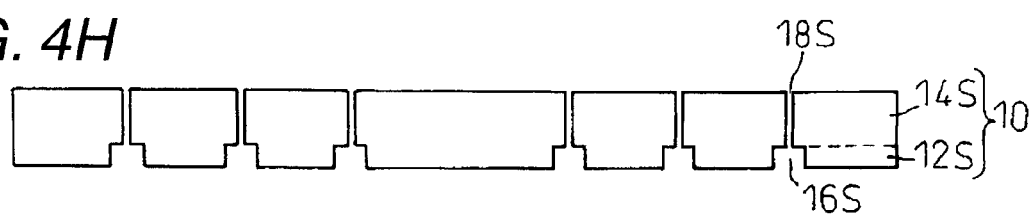

As a result of this, as shown in FIG. 4H, the through holes 18S are formed which penetrate from the back side of the silicon raw substrate 70 through the pockets 16.

By the foregoing processing, as shown in FIG. 4A, the pre-alignment base 10 made of silicon is formed which includes the alignment layer 12S having the solder pockets 16S and the support layer 14S having the through holes 18S.

As described above, according to the present invention, the solder balls can be arranged on the connection pads without using a mask. Therefore, adhesion of a flux onto a mask, which has been unavoidable in the related art, can be prevented.

Further, the paste including the solder balls and the flux is arranged on the connection pads. Therefore, another step of coating the flux on the connection pads is eliminated, and thus the balls and the flux can be arranged simultaneously.

According to the present invention, there is provided a method for arranging solder balls in which fine solder balls can be arranged on connection pads on a substrate without causing insufficient mounting of the solder balls due to adhesion of a flux to a mask.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A method of mounting one conductive ball on each of a plurality of connection pads on a substrate, the method comprising:
   (a) providing a pre-alignment base including: a support layer formed to allow a flux to pass therethrough; and an alignment layer provided on the support layer and having pockets for containing the conductive ball;
   (b) applying a paste containing the conductive balls dispersed in the flux onto the alignment layer such that each of the pockets receives one of the conductive balls together with the flux;
   (c) aligning the pre-alignment base with the substrate such that each of the pockets corresponds to one of the plurality of connections pads; and
   (d) transferring the paste contained in each of the pockets onto the plurality of connection pads, thereby mounting the conductive balls along with the flux on the plurality of connection pads.

2. The method according to claim 1, wherein in step (b), the paste is applied onto the alignment layer with an absorption layer for absorbing the flux being placed in close contact with a back surface of the support layer opposite to a surface on which the alignment layer is provided.

3. The method according to claim 1, wherein the support layer has through holes provided to correspond to the pockets, and the through holes allow the flux to pass therethrough.

4. The method according to claim 1, wherein the support layer is shaped into a mesh to allow the flux to pass therethrough.

5. The method according to claim 1, wherein in step (b), the paste is applied onto the alignment layer by a squeegee.

6. The method according to claim 1, wherein in step (b), the paste is applied onto the alignment layer by piston pressurization.

7. The method according to claim 1, wherein in step (d), the paste is transferred onto the plurality of connection pads by pressing with a presser.

8. The method according to claim 1, wherein in step (d), the paste is transferred onto the plurality of connection pads by gas blast from the back surface of the support layer.

* * * * *